United States Patent
Sato et al.

(10) Patent No.: US 9,460,913 B2
(45) Date of Patent: *Oct. 4, 2016

(54) FILM-FORMING METHOD FOR FORMING SILICON OXIDE FILM ON TUNGSTEN FILM OR TUNGSTEN OXIDE FILM

(71) Applicant: TOKYO ELECTRON LIMITED, Tokyo (JP)

(72) Inventors: Jun Sato, Nirasaki (JP); Pao-Hwa Chou, Nirasaki (JP)

(73) Assignee: TOKYO ELECTRON LIMITED (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/796,295

(22) Filed: Jul. 10, 2015

(65) Prior Publication Data

US 2015/0332917 A1 Nov. 19, 2015

Related U.S. Application Data

(60) Continuation-in-part of application No. 14/190,416, filed on Feb. 26, 2014, now abandoned, which is a division of application No. 13/334,382, filed on Dec. 22, 2011, now abandoned.

(30) Foreign Application Priority Data

Dec. 27, 2010 (JP) ................................ 2010-290565

(51) Int. Cl.
| | |
|---|---|
| C23C 16/00 | (2006.01) |
| H01L 21/02 | (2006.01) |
| H01L 21/285 | (2006.01) |
| C23C 16/02 | (2006.01) |
| C23C 16/40 | (2006.01) |
| C23C 16/455 | (2006.01) |

(52) U.S. Cl.
CPC ..... *H01L 21/02164* (2013.01); *C23C 16/0272* (2013.01); *C23C 16/0281* (2013.01); *C23C 16/402* (2013.01); *C23C 16/45525* (2013.01); *C23C 16/45553* (2013.01); *H01L 21/02175* (2013.01); *H01L 21/02211* (2013.01); *H01L 21/02271* (2013.01); *H01L 21/02299* (2013.01); *H01L 21/02304* (2013.01); *H01L 21/02312* (2013.01); *H01L 21/28568* (2013.01)

(58) Field of Classification Search
CPC .......... C23C 16/0272; C23C 16/0281; C23C 16/402; C23C 16/45525
USPC .................................. 427/248.1, 250, 255.7
See application file for complete search history.

(56) References Cited

U.S. PATENT DOCUMENTS

| | | | |
|---|---|---|---|
| 7,659,158 B2 * | 2/2010 | Ma | H01L 21/28273 257/315 |
| 7,767,594 B2 | 8/2010 | Miya et al. | |
| 2002/0058411 A1 | 5/2002 | Hasegawa et al. | |
| 2006/0032442 A1 * | 2/2006 | Hasebe | C03C 17/245 118/715 |
| 2006/0178019 A1 | 8/2006 | Senzaki et al. | |
| 2013/0109197 A1 | 5/2013 | Murakami et al. | |

FOREIGN PATENT DOCUMENTS

| | | |
|---|---|---|
| JP | 2001274157 | 10/2001 |
| JP | 2006054432 | 2/2006 |
| JP | 2008533731 | 8/2008 |
| JP | 2010183069 | 8/2010 |
| WO | 2006097525 | 9/2006 |

* cited by examiner

*Primary Examiner* — Kelly M Gambetta
(74) *Attorney, Agent, or Firm* — Cantor Colburn LLP

(57) ABSTRACT

A film-forming method includes forming a tungsten film or a tungsten oxide film on an object to be processed, heating the object on which the tungsten film or the tungsten oxide film is formed, forming a seed layer on the tungsten film or the tungsten oxide film by supplying an aminosilane-based gas to a surface of the tungsten film or the tungsten oxide film, and forming a silicon oxide film on the seed layer by simultaneously supplying a silicon material gas including silicon and a gas including an oxidizing agent for oxidizing silicon.

6 Claims, 17 Drawing Sheets

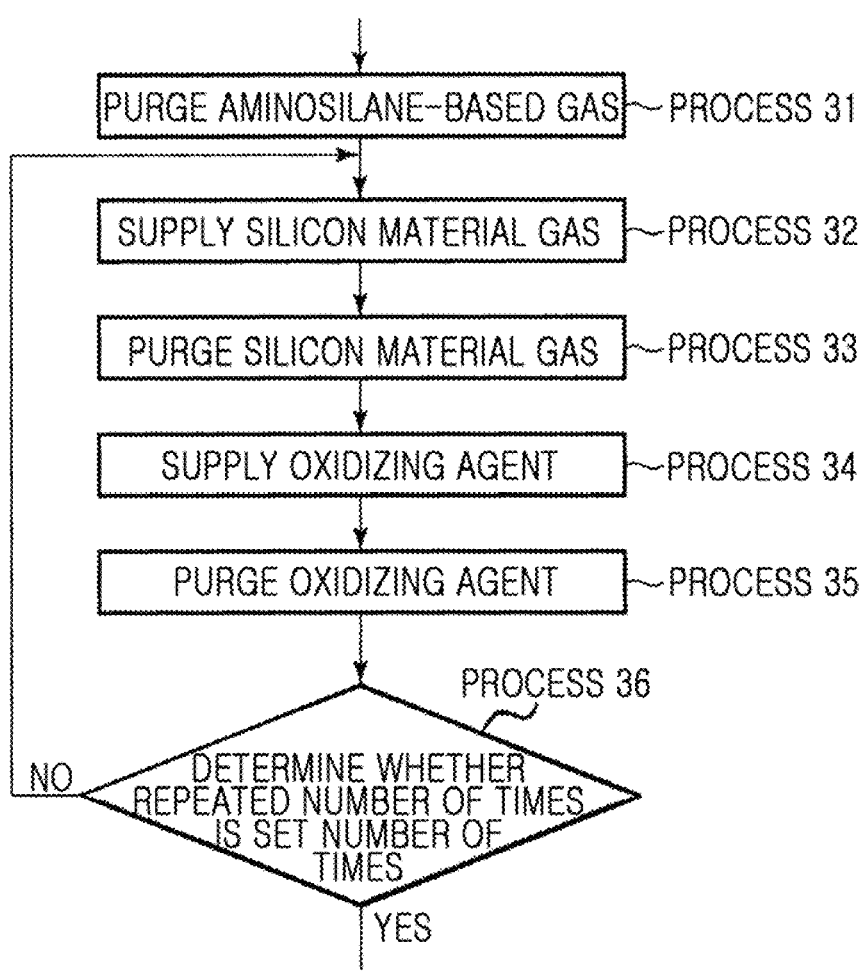

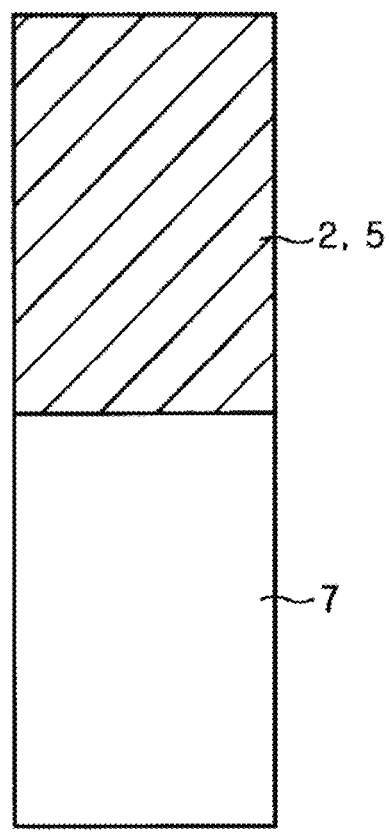

FILM-FORMING METHOD FOR FORMING SILICON OXIDE FILM ON TUNGSTEN FILM OR TUNGSTEN OXIDE FILM

CROSS-REFERENCE TO RELATED PATENT APPLICATIONS

This application is a continuation-in-part application of U.S. application Ser. No. 14/190,416 filed on Feb. 26, 2014 which is a divisional application of prior U.S. application Ser. No. 13/334,382, filed on Dec. 22, 2011, and claims a priority to and the benefit of Japanese Patent Application No. 2010-290565, filed on Dec. 27, 2010 in the Japan Patent Office, the disclosure of which are incorporated herein in its entirety by reference.

BACKGROUND OF THE INVENTION

1. Field of the Invention

The present invention relates to a film-forming method and a film-forming apparatus for forming a silicon oxide film on a tungsten film or a tungsten oxide film.

2. Description of the Related Art

When a semiconductor device is manufactured, a silicon oxide ($SiO_2$) film may be formed on a tungsten film.

For example, a technology of forming a silicon oxide film on a metal such as tungsten is disclosed in Patent Reference 1.

However, when a silicon oxide film is formed on a tungsten (W) film or a tungsten oxide ($WO_3$) film, since a rate at which silicon is adsorbed to a surface of tungsten or tungsten oxide is slow in initial film formation stage, an incubation time taken before the silicon oxide film begins to grow is long. Since the incubation time is long, a film thickness of the silicon oxide film formed on the tungsten film or the tungsten oxide film is less than that of a silicon oxide film formed on a base other than tungsten. Also, when silicon is not sufficiently adsorbed, for example, in the initial film formation stage, since tungsten is oxidized by contacting with an oxidizing agent directly, a tungsten oxide film is further formed.

PRIOR ART REFERENCE (Patent Reference 1) Japanese Patent Laid-Open Publication No. 2006-54432

SUMMARY OF THE INVENTION

The present invention provides a film-forming method and a film-forming apparatus for forming a silicon oxide film on a tungsten film or a tungsten oxide film which may reduce an incubation time of forming the silicon oxide film on the tungsten film or the tungsten oxide film.

According to an aspect of the present invention, there is provided a film-forming method of forming a silicon oxide film on a tungsten film or a tungsten oxide film, the film-forming method including: forming the tungsten film or the tungsten oxide film on an object to be processed; forming a seed layer on the tungsten film or the tungsten oxide film; and forming a silicon oxide film on the seed layer, wherein the forming of the seed layer includes: heating the object to be processed; and forming the seed layer on the tungsten film or the tungsten oxide film by supplying an aminosilane-based gas to a surface of the tungsten film or the tungsten oxide film.

According to another aspect of the present invention, there is provided a film-forming apparatus for forming a silicon oxide film on a tungsten film or a tungsten oxide film, the film-forming apparatus including: a process chamber in which an object to be processed on which the tungsten film or the tungsten oxide film is formed is accommodated; a gas supply mechanism which supplies a gas including at least one of an aminosilane-based gas and a silicon material gas, and a gas including an oxidizing agent into the process chamber; a heating device which heats an inside of the process chamber; an exhauster which evacuates the inside of the process chamber; and a controller which controls the gas supply mechanism, the heating device, and the exhauster, wherein the controller controls the gas supply mechanism, the heating device, and the exhauster to perform the film-forming method of any one of claims 1 through 8 on the object to be processed in the process chamber.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 1B is a flowchart showing an example of process 3 of FIG. 1A;

FIGS. 8A through 8C are cross-sectional views showing a structure, e.g., a gate electrode, in a semiconductor integrated circuit device;

DETAILED DESCRIPTION OF THE INVENTION

Embodiments for Carrying Out the Invention

Figure 1A:
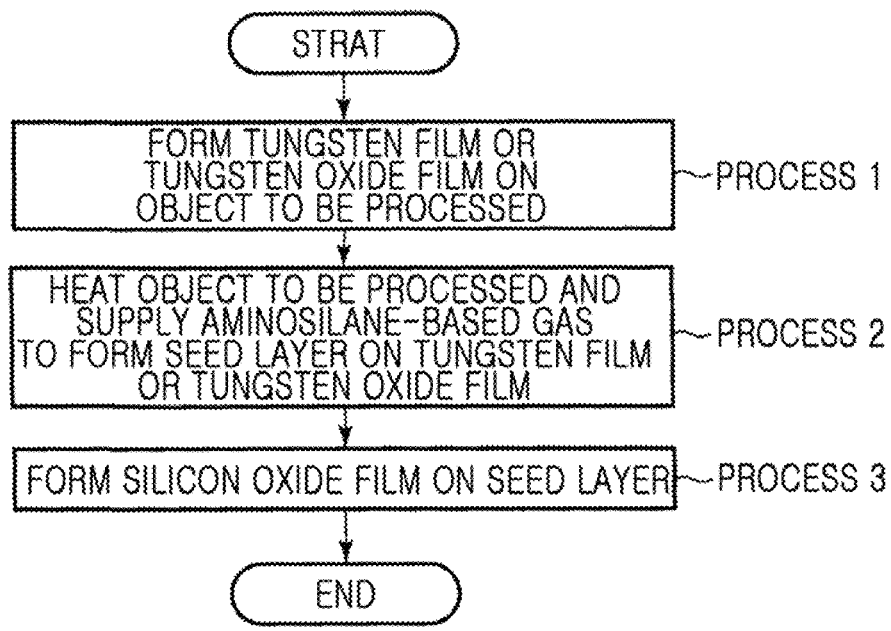
FIG. 1A is a flowchart showing an example of a film-forming method of forming a silicon oxide film on a tungsten film or a tungsten oxide film according to an embodiment of the present invention.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

(Film-Forming Method)

Figure 2A:
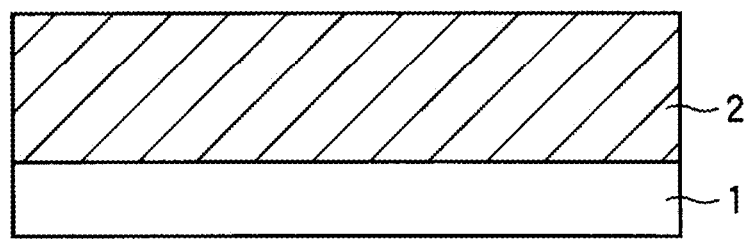
FIGS. 2A through 2C are cross-sectional views schematically showing states of an object to be processed during a sequence of FIGS. 1A and 1B.
Figure 2B:
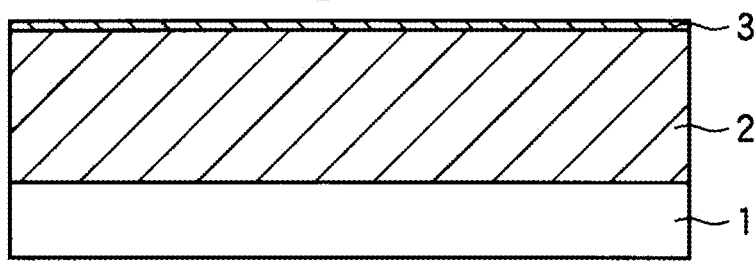
Figure 2C:
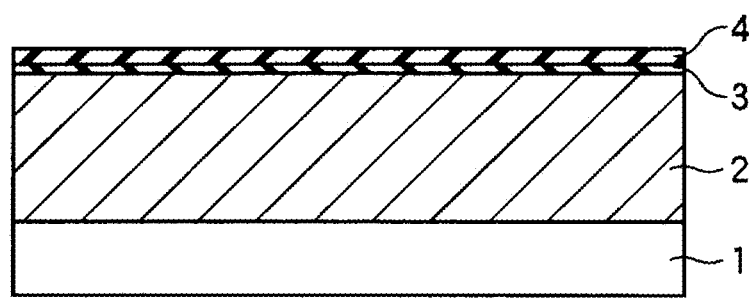

FIG. 1A is a flowchart showing an example of a film-forming method of forming a silicon oxide film on a tungsten film or a tungsten oxide film according to an embodiment of the present invention. FIG. 1B is a flowchart showing an example of process 3 of FIG. 1A. FIGS. 2A through 2C are cross-sectional views schematically showing states of an object to be processed during a sequence of FIGS. 1A and 1B.

First, as shown in process 1 of FIG. 1A, a tungsten film or a tungsten oxide film is formed on an object to be processed. The tungsten oxide film may be a tungsten oxide film which is directly formed on the object to be processed, or a native oxide film which is formed on a surface of a tungsten film formed on the object to be processed. Also, in the present embodiment, a semiconductor wafer, for example, a silicon wafer (W), is used as the object to be processed. A tungsten film 2 is formed on a silicon substrate 1 of the silicon wafer W (see FIG. 2A).

Next, as shown in process 2 of FIG. 1A, a seed layer 3 is formed on the tungsten film 2 (see FIG. 2B). The seed layer 3 in the present embodiment is formed as follows.

First, the silicon wafer W on which the tungsten film 2 is formed is transferred into a process chamber of a film-forming apparatus. Next, a temperature inside the process chamber is increased, the silicon wafer W on which the tungsten film 2 is formed is heated, and an aminosilane-based gas is supplied to a surface of the tungsten film 2 which is heated. Accordingly, the seed layer 3 is formed on the surface of the tungsten film 2.

Examples of the aminosilane-based gas may include BAS (butylaminosilane), BTBAS (bis(tertiarybutylamino)silane), DMAS (dimethylaminosilane), BDMAS (bis(dimethylamino)silane), TDMAS (tri(dimethylamino)silane), DEAS (diethylaminosilane), BDEAS (bis(diethylamino)silane), DPAS (dipropylaminosilane), and DIPAS (diisopropylaminosilane). In the present embodiment, DIPAS is used.

Process conditions in process 2 are as follows:
DIPAS flow rate: 500 sccm,
process time: 5 min,
process temperature: 25° C., and
process pressure: 532 Pa (4 Torr). The process 2 is hereinafter referred to as a pre-flow.

Process 2 is a process for enabling a silicon raw material to be easily adsorbed to the tungsten film 2. Also, herein, although the seed layer 3 is formed in process 2, a film is rarely actually formed. It is preferable that a thickness of the seed layer 3 be about a thickness of a monoatomic layer. Specifically, a thickness of the seed layer 3 is equal to or greater than 0.1 nm and equal to or less than 0.3 nm.

Next, as shown in process 3 of FIG. 1A, an oxide film, that is, a silicon oxide film 4 in the present embodiment, is formed on the seed layer 3 (see FIG. 2C).

Process 3 is shown in FIG. 1B. In the present embodiment, in order to form the silicon oxide film 4, atomic layer deposition (ALD) method or molecular layer deposition (MLD) method which forms a film by alternately supplying a silicon material gas including silicon and a gas including an oxidizing agent for oxidizing silicon is used. The oxidizing agent may be $O_2$, $O_3$, $H_2O$, or active species thereof which are activated by using plasma. In the present embodiment, oxygen (O) radicals which are generated by using $O_2$ plasma are used.

First, as shown in process 31, an inert gas, for example, a nitrogen ($N_2$) gas, is supplied into the process chamber, and the aminosilane-based gas is purged.

Next, as shown in process 32, a silicon material gas is supplied into the process chamber, and a silicon layer is formed on the seed layer 3. Examples of the silicon material gas may include the aminosilane-based gas used in process 2, and a silane-based gas not including an amino group. Examples of a silane-based gas not including an amino group may be a gas including at least one of:
$SiH_2$,
$SiH_4$,
$SiH_6$,
$Si_2H_4$,
$Si_2H_6$,
a silicon hydride that may be expressed as $Si_mH_{2m+2}$ (here, m is a natural number equal to or greater than 3), and
a silicon hydride that may be expressed as $Si_nH_{2n}$ (here, n is a natural number equal to or greater than 3).

Also, DIPAS is used as the aminosilane-based gas in the present embodiment.

Process conditions in process 32 are as follows:
DIPAS flow rate: 500 sccm,
process time: 0.1 min,
process temperature: 25° C., and
process pressure: 532 Pa (4 Torr).

Next, as shown in process 33, an inert gas, for example, a nitrogen gas, is supplied into the process chamber, and the silicon material gas is purged.

Next, as shown in process 34, a gas including an oxidizing agent is supplied into the process chamber, and thus the silicon layer formed in process 32 is oxidized, thereby forming the silicon oxide film 4. In process 34, $O_2$, $O_3$, $H_2O$, or active species thereof which are activated by using plasma may be used as the oxidizing agent. In the present embodiment, oxygen (O) radicals which are generated by using $O_2$ plasma are used.

Next, as shown in process 35, an inert gas, for example, a nitrogen gas, is supplied into the process chamber, and the gas including the oxidizing agent is purged.

Next, as shown in process 36, it is determined whether a repeated number of times is a set number of times.

If it is determined in process 36 that the repeated number of times has not reach the set number of times (NO), the film-forming method returns to process 32, and process 32 through process 35 are repeatedly performed.

If it is determined in process 36 that the repeated number of times has reached the set number of times (YES), the film-forming method finishes as shown in FIG. 1A.

(Incubation Time)

Figure 3:
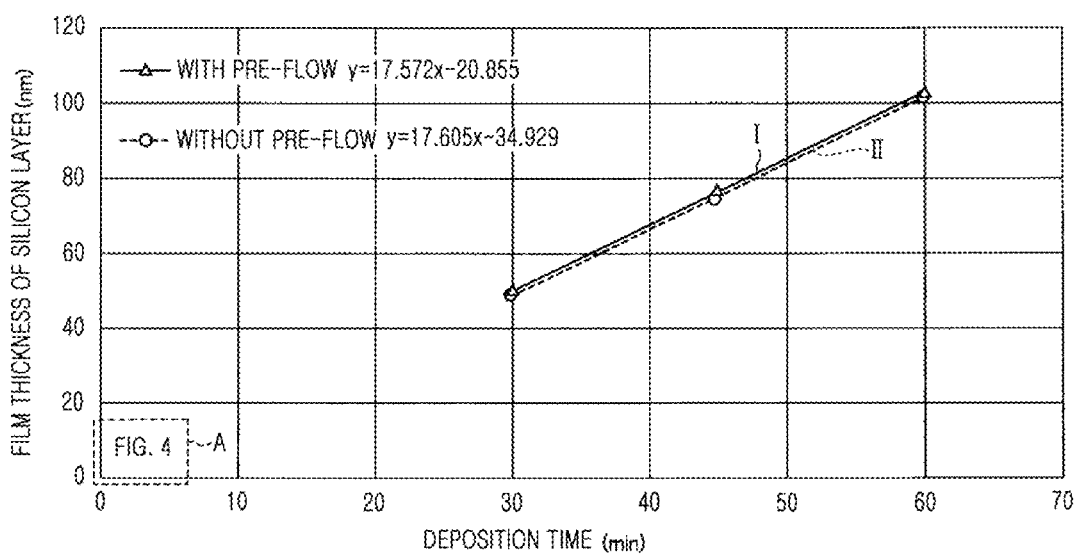
FIG. 3 is a view showing a relationship between a deposition time and a film thickness of a silicon layer.

FIG. 3 shows a relationship between a deposition time and a film thickness of a silicon layer. Although a result shown in FIG. 3 is obtained when a base is silicon oxide ($SiO_2$), the same result may be obtained even when the base is tungsten or tungsten oxide. This is because the seed layer 3 obtained during the pre-flow in which the aminosilane-based gas is thermally decomposed is formed on the base. The silicon layer is formed by being adsorbed to the seed layer 3.

Process conditions of the pre-flow used in the present embodiment are as follows:
DIPAS flow rate: 500 sccm,
process time: 5 min,
process temperature: 400° C., and
process pressure: 53.2 Pa (0.4 Torr).

Likewise, process conditions for forming a silicon layer used in the present embodiment are as follows:
monosilane flow rate: 500 sccm,
deposition time: 30 min/45 min/60 min,
process temperature: 500° C., and
process pressure: 53.2 Pa (0.4 Torr).

A film thickness of the silicon layer was measured at three points when the deposition time was 30 min, 45 min, and 60 min.

Line I and line II shown in FIG. 3 show a result obtained in a case where the pre-flow process is performed and a result obtained in a case where the pre-flow process is not performed, respectively. The line I and the line II are straight lines obtained by straight-line approximating the three measured film thicknesses by using a least-squares method. Formulas thereof are as follows:

$$\text{line } I: y=17.572x-20.855 \quad (1), \text{ and}$$

$$\text{line } II: y=17.605x-34.929 \quad (2).$$

As shown in FIG. 3, it is obvious that when there is a pre-flow, a film thickness of the silicon layer 4 is greater than that when there is no pre-flow.

Figure 4:
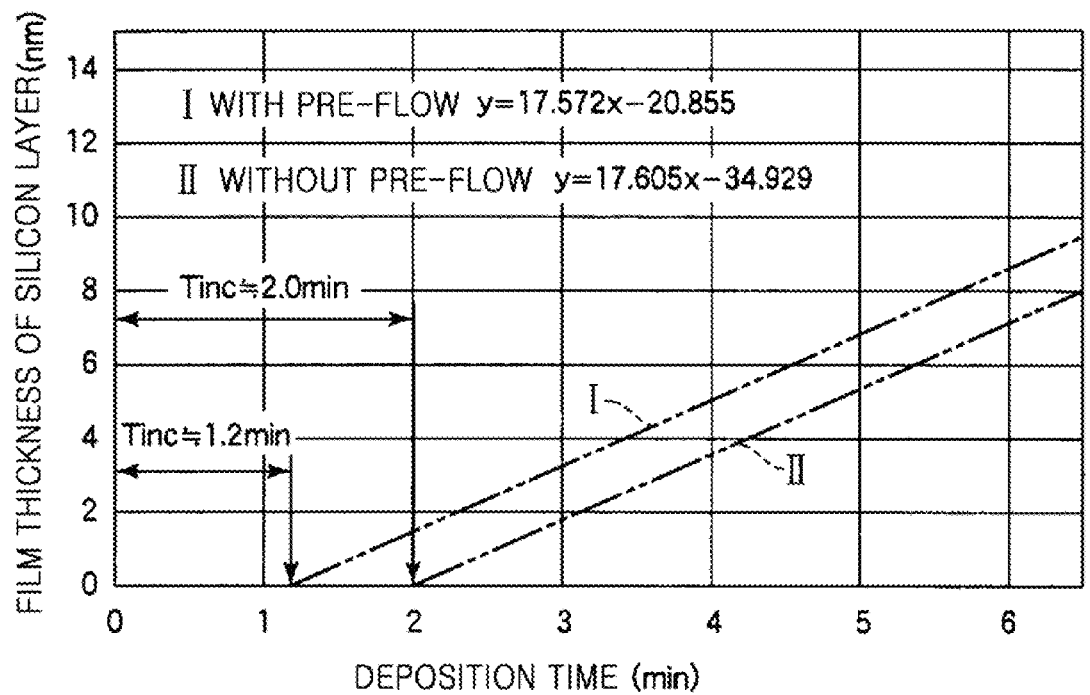
FIG. 4 is an enlarged view of the portion A of FIG. 3 indicated by the broken line.

A relationship between a film thickness and a deposition time of each of the lines I and II when y=0 in Formulas 1 and 2, that is, when a film thickness of the silicon layer is "0", is shown in FIG. 4. Also, FIG. 4 is an enlarged view of the portion A of FIG. 3 indicated by the broken line.

As shown in FIG. 4, if there is a pre-flow, the silicon layer begins to deposit about 1.2 min (x≈1.189) after the process begins. On the other hand, if there is no pre-flow, the silicon layer begins to deposit about 2.0 min (x≈1.984) after the process begins.

As such, when a pre-flow using an aminosilane-based gas is performed on a base, an incubation time may be reduced from about 2.0 min to about 1.2 min.

(Scanning Electron Microscopy (SEM) Image of Silicon Oxide Film)

Next, a result obtained after observing a silicon oxide film by using SEM is described.

Figure 5A:
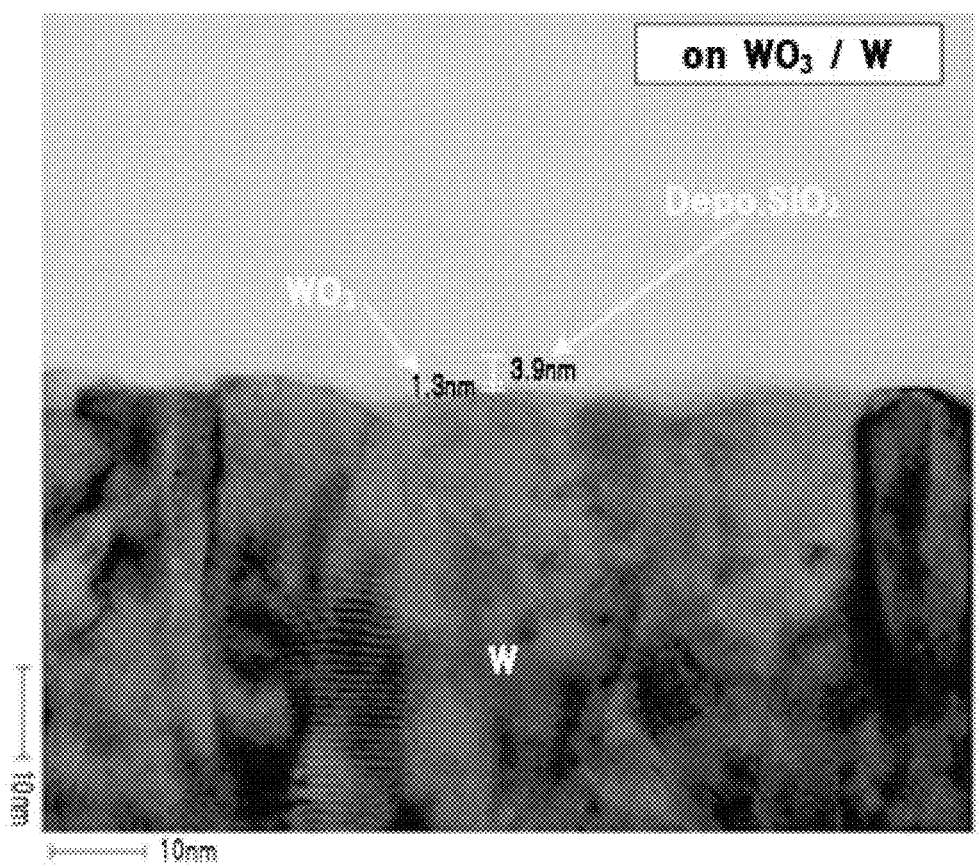
FIG. 5A is a scanning electron microscope (SEM) image.
Figure 5B:
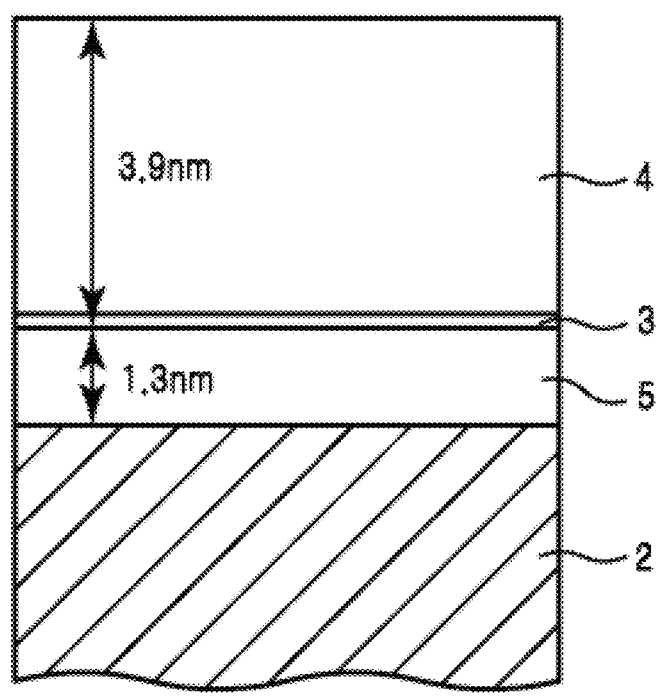
FIG. 5B is a view showing a film thickness.
Figure 6A:
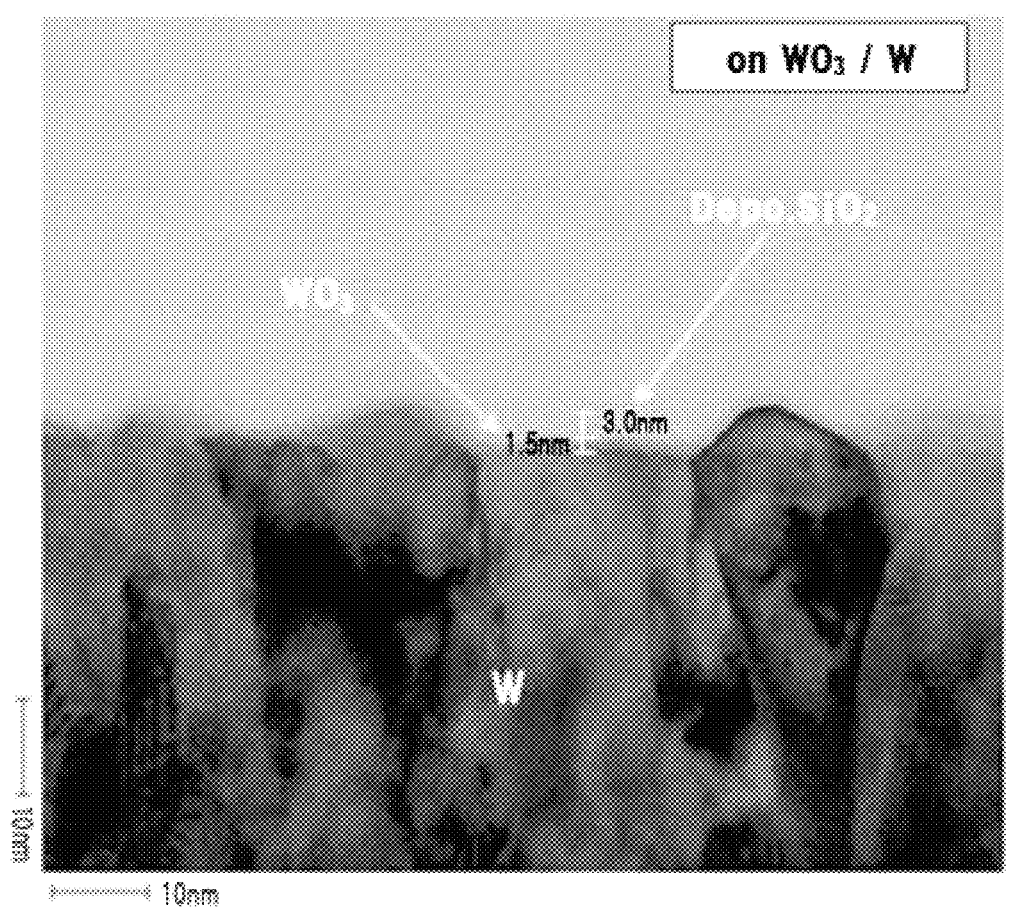
FIG. 6A is an SEM image.
Figure 6B:
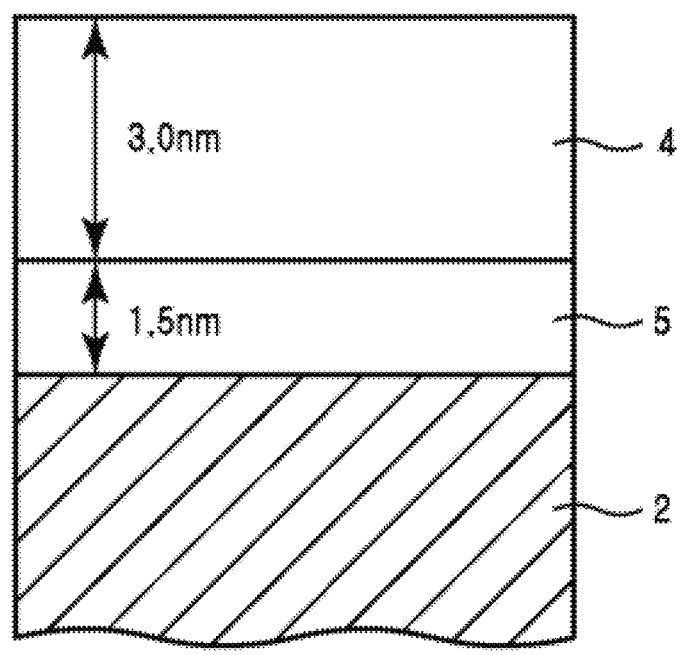
FIG. 6B is a view showing a film thickness.

FIGS. 5A and 5B are views showing the silicon oxide film 4 formed by using the film-forming method of forming a silicon oxide film on a tungsten film or a tungsten oxide film according to the present embodiment. FIG. 5A shows an SEM image, and FIG. 5B shows a film thickness. FIGS. 6A and 6B show a comparative example in which there is no pre-flow. The silicon oxide film 4 was formed by setting a repeated number of times for film formation to 20. Also, a tungsten oxide ($WO_3$) film 5 which is thin is formed on a surface of the tungsten film 2. The tungsten oxide film 5 is a native oxide film which is naturally formed through contact with oxygen in the air. Of course, the tungsten oxide film 5 may be omitted.

As shown in FIGS. 5A and 5B, according to the present embodiment, the silicon oxide film 4 having a film thickness of 3.9 nm (including an oxide film thickness of the seed layer 3) is formed on the tungsten film 2 with the tungsten oxide film 5 having a film thickness of 1.3 nm therebetween.

However, as shown in FIGS. 6A and 6B, according to the comparative example in which there is no pre-flow, only the silicon oxide film 4 having a film thickness of 3.0 nm is formed on the tungsten film 2 with the tungsten oxide film 5 having a film thickness of 1.5 nm therebetween.

As such, according to the present embodiment, as compared to the comparative example in which there is no pre-flow, an incubation time may be reduced and the silicon oxide film 4 having a great film thickness of about 30% may be formed on the tungsten film 2 even with the same 20 cycles.

Also, although a film thickness of the tungsten oxide film 5 in the present embodiment is 1.3 nm, a film thickness of the tungsten oxide film 5 in the comparative example is 1.5 nm.

In this regard, according to the present embodiment, when the silicon oxide film 4 is formed on the tungsten film 2, the tungsten oxide film 5 may be suppressed from being further formed on an interface. This seems to be because since the seed layer 3 is formed on the surface of the tungsten film 2 in the present embodiment, an oxidizing agent may be prevented from directly contacting the tungsten oxide 2 or the tungsten oxide film 5.

Figure 7A:
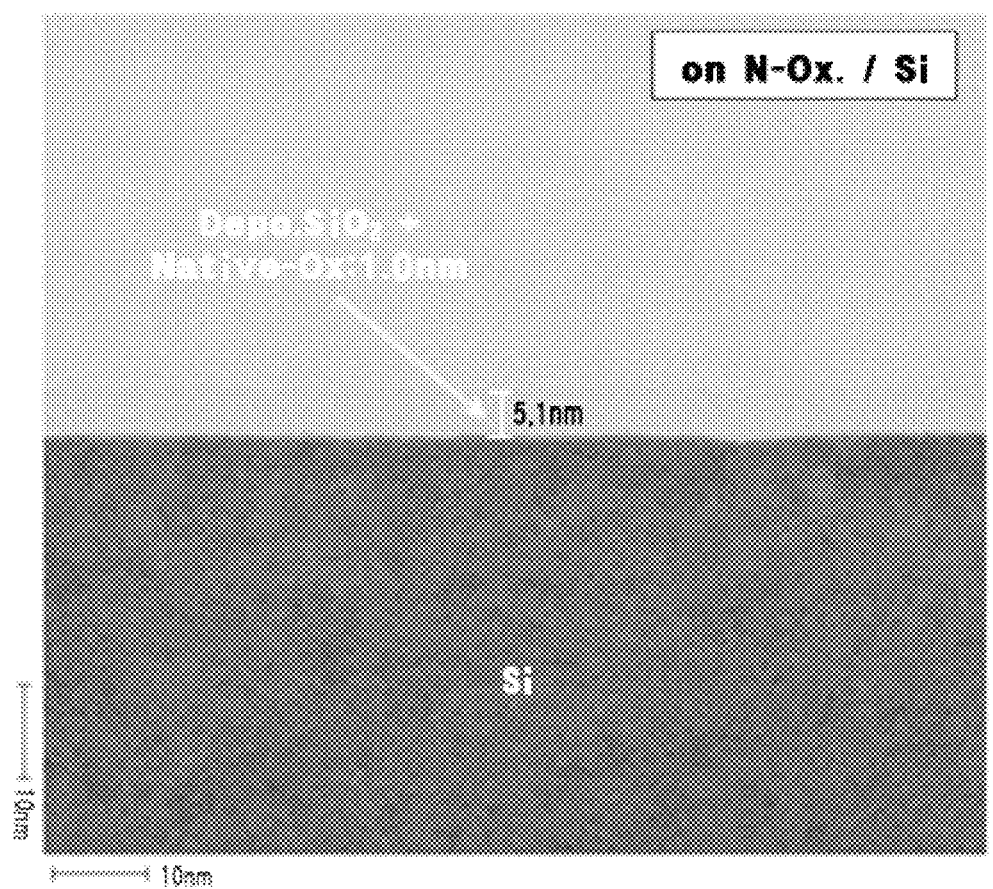
FIG. 7A is an SEM image.
Figure 7B:
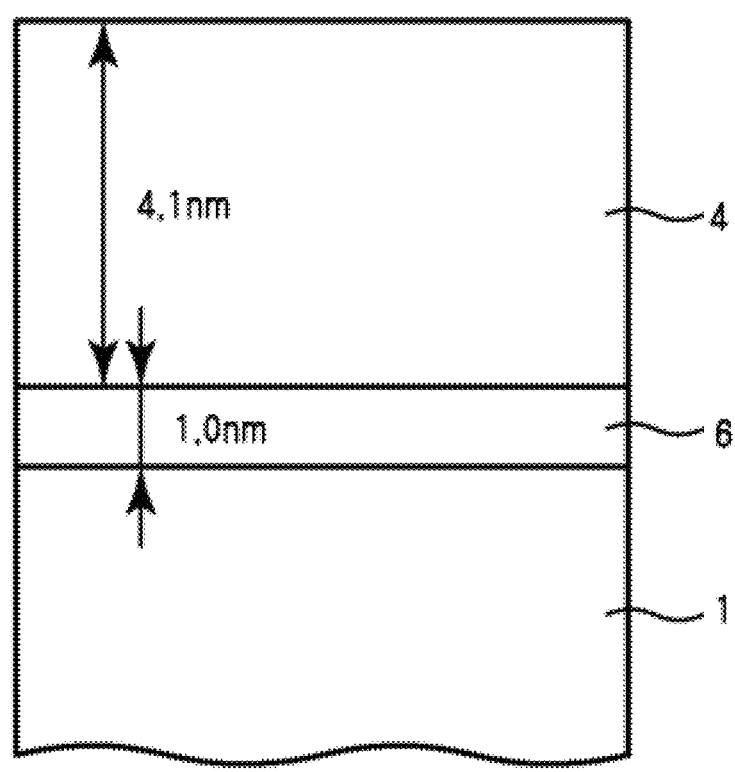
FIG. 7B is a view showing a film thickness.

FIGS. 7A and 7B show a case where the silicon oxide film 4 is formed on the silicon substrate 1. FIG. 7A shows an SEM image, and FIG. 7B shows a film thickness. In the present embodiment, the silicon oxide film 4 was formed under the same process conditions and with the same repeated number of times (20 cycles) as those in a case of FIGS. 5A and 5B. Also, a native oxide film ($SiO_2$) 6 having a thickness of 1 nm is formed on a surface of the silicon substrate 1.

As shown in FIGS. 7A and 7B, in this case, the silicon oxide film 4 having a film thickness of 4.1 nm is formed on the silicon substrate 1 with the native oxide film 6 therebetween.

In this regard, according to the present embodiment, the following advantages may be achieved.

Figure 8B:
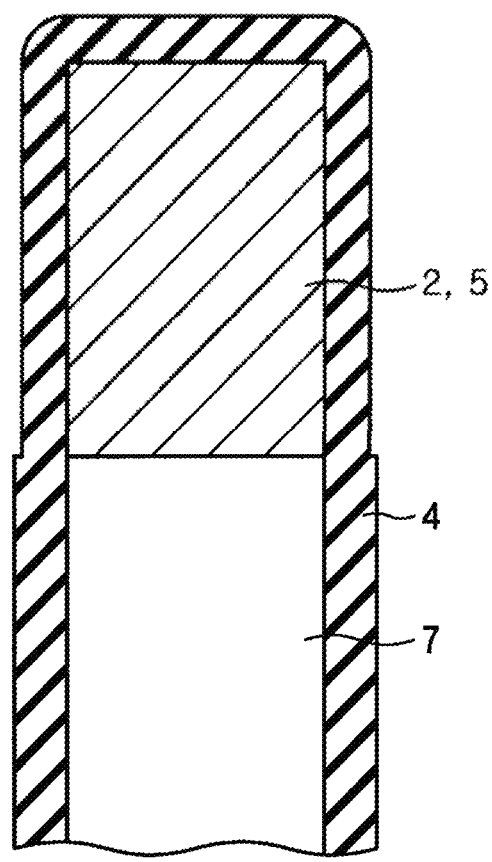
Figure 8C:
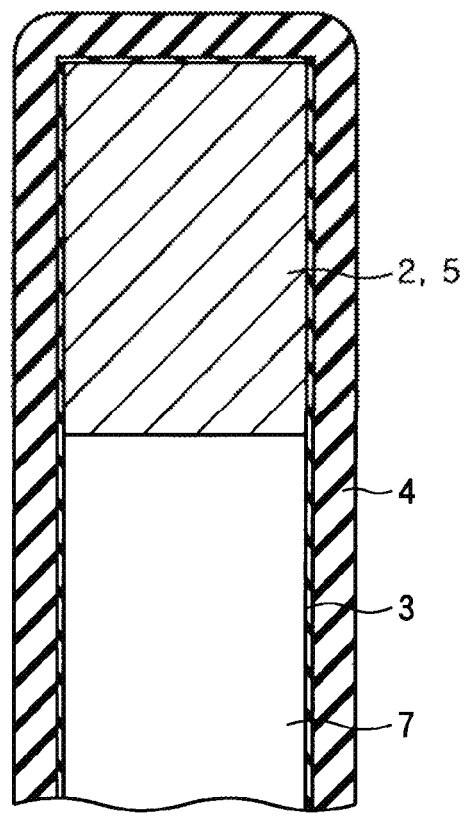

FIGS. 8A through 8C are cross-sectional views showing a structure, for example, a gate electrode, in a semiconductor integrated circuit device.

As shown in FIG. 8A, there is a gate electrode having a so-called poly-metal structure in which the tungsten film 2 is deposited on a polysilicon layer 7. When the silicon oxide film 4 is formed on a side wall of the gate electrode having the poly-metal structure, if there is no pre-flow, a difference between a film thickness of the silicon oxide film 4 on the polysilicon layer 7 and a film thickness of the silicon oxide film 4 on the tungsten film 2 is high (see FIG. 8B). For example, as shown in FIG. 6B, in the comparative example in which there is no pre-flow, a film thickness of the silicon oxide film 4 on the tungsten film 2 was 3.0 nm. Accordingly, film thickness non-uniformity of the silicon oxide film 4 is high.

On the other hand, as shown in FIG. 5B, according to the present embodiment, a film thickness of the silicon oxide film 4 on the tungsten film 2 was 3.9 nm. Accordingly, a difference between a film thickness of the silicon oxide film 4 on the polysilicon layer 7 and a film thickness of the silicon oxide film 4 on the tungsten film 2 may be less than that in the comparative example (see FIG. 8C).

As such, according to the present embodiment, an incubation time may be reduced, and even when a process time or a repeated number of times is low, the silicon oxide film 4 having a great film thickness may be formed on the tungsten film 2. In addition, when the silicon oxide film 4 is formed on a structure in a semiconductor integrated circuit device where both silicon and tungsten are exposed, film thickness non-uniformity of the silicon oxide film may be low. That is, as shown in FIG. 8A, the tungsten film 2 or the tungsten oxide film 5 has an exposed surface (referred to as a first exposed surface), and the polysilicon layer 7 has an exposed surface (referred to as a second exposed surface).

The first exposed surface and the second exposed surface are contacted with each other at an interface between the tungsten film 2 or the tungsten oxide film 5 and the polysilicon layer 7.

Also, when the silicon oxide film 4 is formed, the tungsten oxide film 5 may be suppressed from being further formed on an interface. According to the present embodiment, therefore, as shown in FIG. 8C, the seed layer 3 is formed both on the exposed surface of the tungsten oxide film 5 or the tungsten film 2 (i.e., the first exposed surface) and on the exposed surface of the polysilicon layer 7 (i.e., the second exposed surface). That is, the seed layer 3 is formed on the first exposed surface and on the second exposed surface. The seed layer 3 becomes a barrier wall which blocks diffusion of an oxidizing agent during film formation of the silicon oxide film 4, particularly, during an initial film formation stage of the silicon oxide film 4. Accordingly, it is difficult for the tungsten oxide film 5 or the tungsten film 2 to directly contact the oxidizing agent, thereby suppressing further formation of the tungsten oxide film 5.

(Another Film-Forming Method)

Next, another film-forming method of forming an oxide film on a tungsten film will be explained.

Figure 9A:
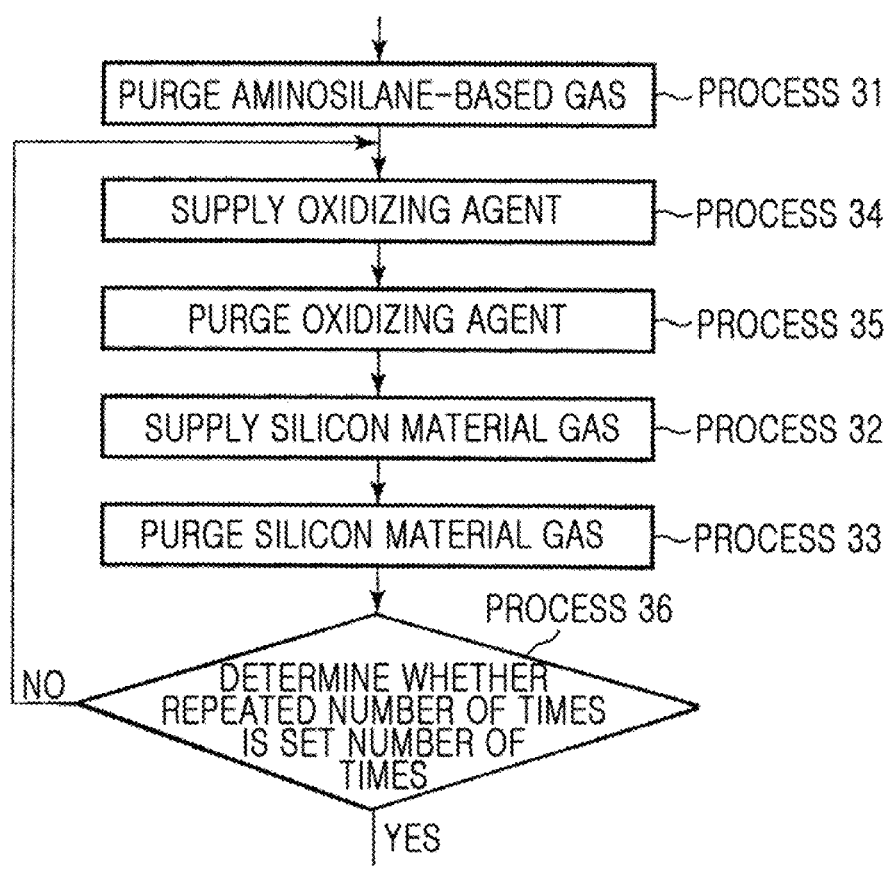
FIGS. 9A through 9C are flowcharts showing another example of process 3.
Figure 9B:
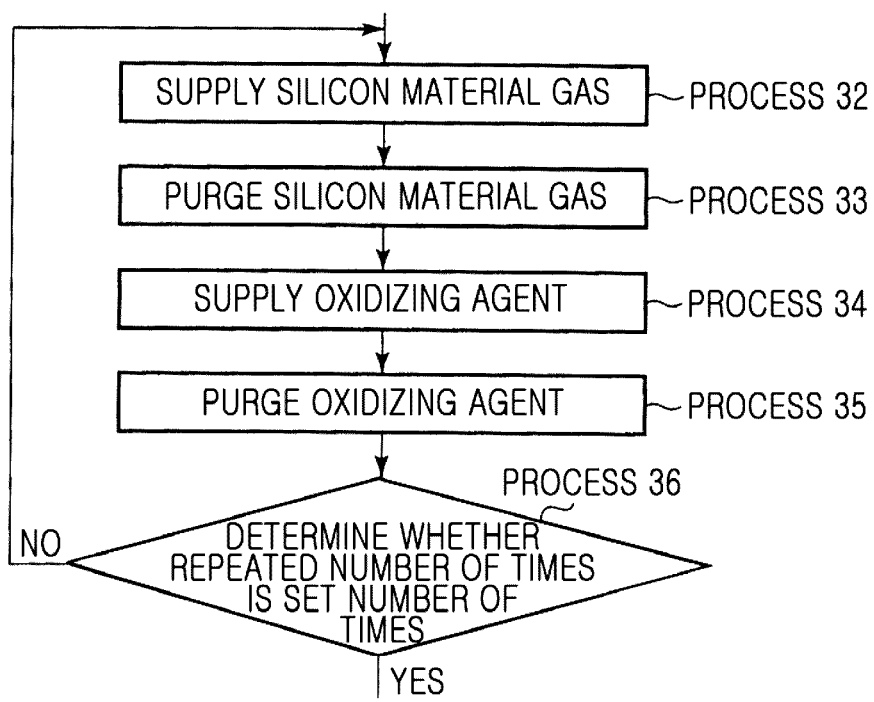
Figure 9C:
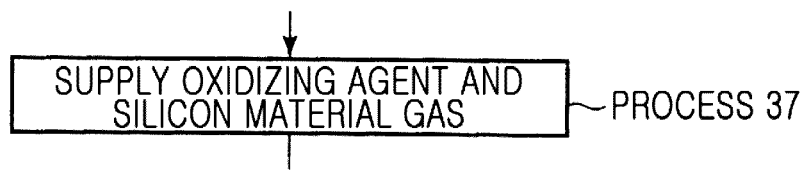

FIGS. 9A through 9C are flowcharts showing another example of process 3 according to another embodiment of the present invention.

First Example

As shown in FIG. 9A, a first example is an example in which sequence of processes 32 and 33 and processes 34 and 35 shown in FIG. 1B is modified. As such, after an aminosilane-based gas is purged (in process 31), an oxidizing agent may be supplied (in process 34).

Second Example

As shown in FIG. 9B, a second example is an example in which a process of purging an aminosilane-based gas is omitted, the aminosilane-based gas is supplied, a predetermined process time passes, and then a silicon material gas is supplied. As such, a process of purging an aminosilane-based gas may be omitted.

Third Example

As shown in FIG. 9C, a third example is an example in which the silicon oxide film 4 is formed through chemical vapor deposition (CVD) by simultaneously supplying a silicon material gas including silicon and a gas including an oxidizing agent for oxidizing silicon. As such, the silicon oxide film 4 may be formed by using CVD.

(Film-Forming Apparatus)

Next, a film-forming apparatus which may perform the film-forming method of forming a silicon oxide film on a tungsten film or a tungsten oxide film according to an embodiment of the present invention will be explained.

Figure 10:
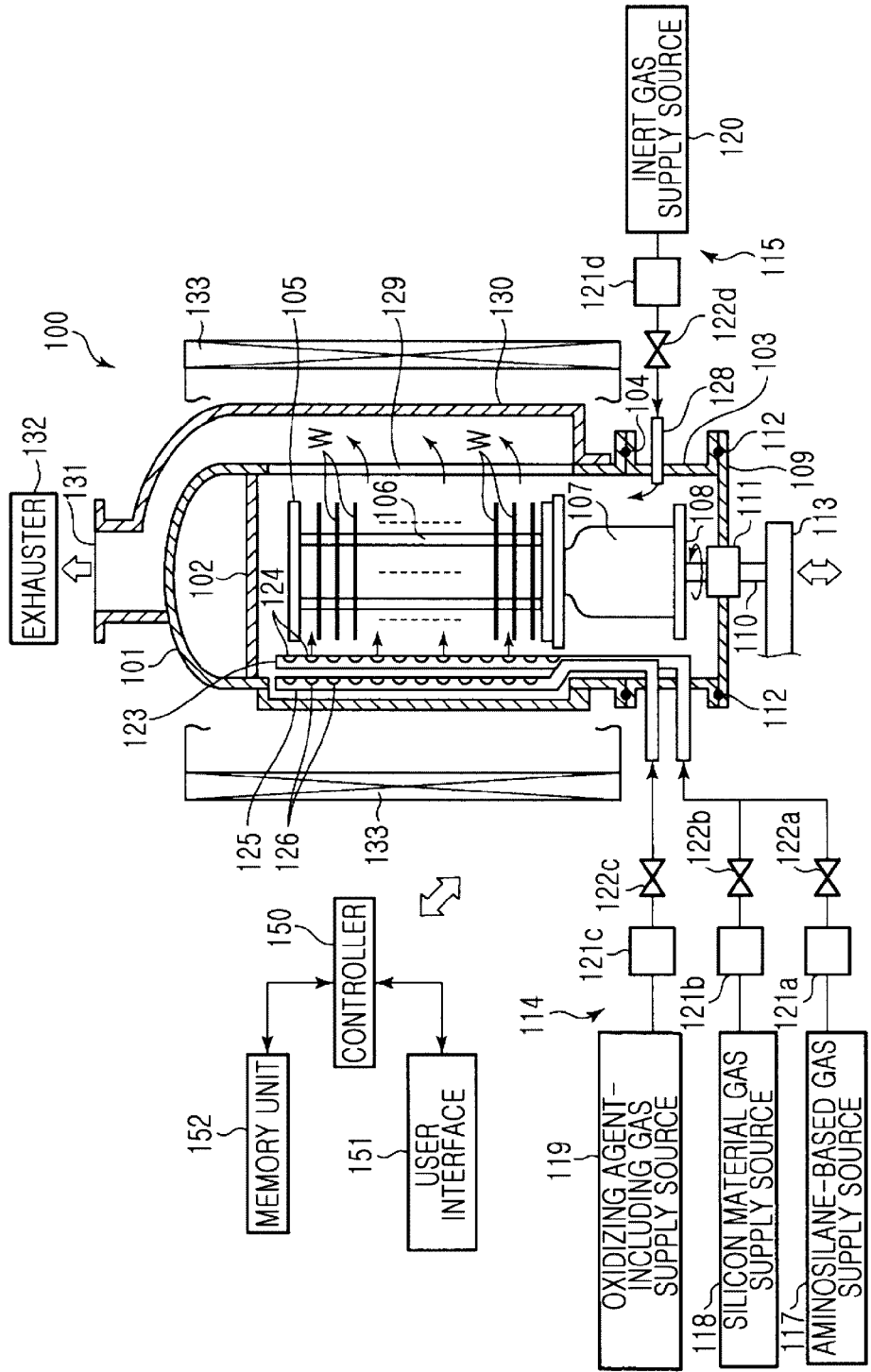
FIG. 10 is a cross-sectional view schematically showing an example of a film-forming apparatus which may perform the film-forming method of forming a silicon oxide film on a tungsten film or a tungsten oxide film according to an embodiment of the present invention.

FIG. 10 is a cross-sectional view schematically showing an example of a film-forming apparatus which may perform the film-forming method of forming a silicon oxide film on a tungsten film or a tungsten oxide film according to an embodiment of the present invention.

As shown in FIG. 10, the film-forming apparatus 100 includes a process chamber 101 having a shape of a bottom-open cylinder with a ceiling. The entire process chamber 101 is formed of quartz, for example. A quartz ceiling plate 102 is provided on the ceiling of the process chamber 101. A manifold 103, which is molded of a stainless steel, for example, and has a cylindrical shape, is connected to a bottom opening of the process chamber 101 via a sealing member 104, such as an O-ring.

The manifold 103 supports the bottom of the process chamber 101. A quartz wafer boat 105, on which a plurality of, for example, 50 to 100, semiconductor substrates (the silicon wafers W in the present embodiment) as objects to be processed can be held in multiple layers, may be inserted from below the manifold 103 into the process chamber 101. The wafer boat 105 has a plurality of pillars 106, so that a plurality of the silicon wafers W are supported by grooves formed on the pillars 106.

The wafer boat 105 is disposed on a table 108 via a quartz thermos vessel 107. The table 108 is supported by a rotation shaft 110, which penetrates, for example, a stainless steel cover unit 109 for opening and closing the bottom opening of the manifold 103. A magnetic fluid seal 111, for example, is provided on a portion of the rotation shaft 110 penetrating the cover unit 109 so as to tightly seal the rotation shaft 110 and to rotatably support the rotation shaft 110. A sealing member 112, e.g., an O-ring, is installed between the peripheral portion of the cover unit 109 and the bottom of the manifold 103. Accordingly, sealing of the process chamber 101 is held. The rotation shaft 110 is attached to the leading end of an arm 113 supported by an elevating mechanism (not shown), such as a boat elevator, or the like. Therefore, the wafer boat 105, the cover unit 109, and the like are elevated together and are inserted to and pulled out from the process chamber 101.

The film-forming apparatus 100 includes a process gas supply mechanism 114 supplying a gas used in a process into the process chamber 101, and an inert gas supply mechanism 115 supplying an inert gas into the process chamber 101.

The process gas supply mechanism 114 includes an aminosilane-based gas supply source 117, a silicon material gas supply source 118, and an oxidizing agent-including gas supply source 119. An example of an aminosilane-based gas is DIPAS, an example of a silicon material gas is DIPAS, and an example of an oxidizing agent-including gas is an oxygen ($O_2$) gas. Also, when the aminosilane-based gas and the silicon material gas are the same, the aminosilane-based gas supply source 117 and the silicon material gas supply source 118 may be shared, and only one of the aminosilane-based gas supply source 117 and the silicon material gas supply source 118 may be provided.

The inert gas supply mechanism 115 includes an inert gas supply source 120. An inert gas is used as a purge gas or the like. An example of the inert gas is a nitrogen ($N_2$) gas.

The aminosilane-based gas supply source 117 is connected to a distribution nozzle 123 through a flow rate controller 121a and an opening/closing valve 122a. The distribution nozzle 123, for example, a quartz pipe, inwardly passes through a side wall of the manifold 103, is bent upward, and vertically extends. A plurality of gas ejection holes 124 are provided at predetermined intervals in a vertical portion of the distribution nozzle 123. The aminosilane-based gas is substantially uniformly ejected into the process chamber 101 in a horizontal direction from the gas ejection holes 124.

Also, the silicon material gas supply source 118 is connected to, for example, the distribution nozzle 123, through a flow rate controller 121b and an opening/closing valve 122b.

The oxidizing agent-including gas supply source 119 is connected to a distribution nozzle 125 through a flow rate controller 121c and an opening/closing valve 122c. The distribution nozzle 125, for example, a quartz pipe, inwardly passes through the side wall of the manifold 103, is bent upward, and vertically extends. A plurality of gas ejection holes 126 are provided at predetermined intervals in a vertical portion of the distribution nozzle 125. A gas including ammonia is substantially uniformly ejected into the process chamber 101 in a horizontal direction from the gas ejection holes 126.

The inert gas supply source 120 is connected to a nozzle 128 through a flow rate controller 121d and an opening/closing valve 122d. The nozzle 128 passes through the side wall of the manifold 103, and allows an inert gas to be ejected into the process chamber 101 in a horizontal direction from a leading end of the nozzle 128.

An exhaust port 129 for evacuating an inside of the process chamber 101 is provided at a portion of the process chamber 101 opposite to the distribution nozzles 123 and 125. The exhaust port 129 is longitudinally and narrowly provided by vertically cutting off a side wall of the process chamber 101. An exhaust port cover member 130 having a U-shaped cross-section and provided to cover the exhaust port 129 is attached by being welded to a portion of the process chamber 101 corresponding to the exhaust port 129. The exhaust port cover member 130 extends upward along the side wall of the process chamber 101 to define a gas outlet 131 at an upper side of the process chamber 101. An exhauster 132 including a vacuum pump or the like is connected to the gas outlet 131. The exhauster 132 exhausts a process gas used in a process from the process chamber 101, and makes a pressure in the process chamber 101 be a process pressure according to a process.

A heating device 133 having a cylindrical shape is provided around an outer circumference of the process chamber 101. The heating device 133 activates a gas supplied into the process chamber 101, and heats the object to be processed, that is, the silicon wafer W in the present embodiment, held in the process chamber 101.

Each element of the film-forming apparatus 100 is controlled by a controller 150 including, for example, a microprocessor (computer). A user interface 151 including a keyboard for inputting a command in order for an operator to manage the film-forming apparatus 100, a display that visually displays an operation state of the film-forming apparatus 100, and so on is connected to the controller 150.

A memory unit 152 is connected to the controller 150. A control program for performing various processes performed in the film-forming apparatus 100 under the control of the controller 150, or a program, that is, a recipe, for performing a process in each element of the film-forming apparatus 100 according to process conditions is stored in the memory unit 152. The recipe is stored in, for example, a storage medium, of the memory unit 152. The storage medium may be a hard disc or a semiconductor memory, or a portable type such as a CD-ROM, a DVD, or a flash memory. Also, the recipe may be appropriately transmitted from another device via, for example, a dedicated line. If required, desired processes are performed by the film-forming apparatus 100 under the control of the controller 150 by invoking a recipe from the memory unit 152 according to instructions or the like from the user interface 151 and performing a process based on the recipe in the controller 150.

In the present embodiment, under the control of the controller 150, the film-forming method of forming a silicon oxide film on a tungsten film or a tungsten oxide film of the embodiment, for example, processes according to processes shown in FIGS. 1A, 1B, and 9A through 9C, are sequentially performed.

The film-forming method of forming a silicon oxide film on a tungsten film or a tungsten oxide film of the embodiment may be performed by the film-forming apparatus 100 of FIG. 10.

Although the present invention has been explained with reference to the embodiments, the present invention is not limited to the embodiments, and various modifications may be made. Also, the embodiments of the present invention are not unique embodiments.

For example, a $H_2O$ gas or an ozone ($O_3$) gas instead of an oxygen gas may be used as an oxidizing agent. If the ozone gas is used, an ozonizer for generating an ozone gas may be provided in the oxidizing agent-including gas supply source 119.

Also, $O_2$, $O_3$, and $H_2O$ may be activated by using plasma, and active species obtained by activating $O_2$, $O_3$, and $H_2O$ may be ejected to an object to be processed such as the silicon wafer W. In this case, a plasma generating mechanism for generating plasma in the process chamber 101 may be provided in, for example, an inside of the process chamber 101.

Also, although an aminosilane-based gas is used as a silicon material gas in the embodiments, when a silicon layer is formed on the seed layer 3, a silane-based gas may be used. A silicon hydride expressed as $Si_mH_{2m+2}$ (here, m is a natural number equal to or greater than 3) or a silicon hydride expressed as $Si_nH_{2n}$ (here, n is a natural number equal to or greater than 3) may be used.

The silicon hydride expressed as $Si_mH_{2m+2}$ (here, m is a natural number equal to or greater than 3) may be at least one of:

trisilane ($Si_3H_8$),
tetrasilane ($Si_4H_{10}$),
pentasilane ($Si_5H_{12}$),
hexasilane ($Si_6H_{14}$), and
heptasilane ($Si_7H_{16}$), and the silicon hydride expressed as $Si_nH_{2n}$ (here, n is a natural number equal to or greater than 3) may be at least one of:

cyclotrisilane ($Si_3H_6$),
cyclotetrasilane ($Si_4H_8$),
cyclopentasilane ($Si_5H_{10}$),
cyclohexasilane ($Si_6H_{12}$), and
cycloheptasilane ($Si_7H_{14}$).

Also, although the present invention is applied to a batch-type film-forming apparatus in which film formation is collectively performed on a plurality of the silicon wafers W in the above embodiments, the present invention is not limited thereto, and the present invention may be applied to a single-type film-forming apparatus in which film formation is performed on a single wafer at a time.

Also, although a semiconductor wafer is used as an object to be processed in the above embodiments, the present invention is not limited thereto, and another substrate such as an LCD glass substrate may be used.

Also, various other modifications may be made in the present invention without departing from the scope of the invention.

According to the present invention, a film-forming method of forming a silicon oxide film on a tungsten film or a tungsten oxide film which may reduce an incubation time of forming the silicon oxide film on the tungsten film or the tungsten oxide film, and a film-forming apparatus which may perform the film-forming method may be provided.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A film-forming method of forming a silicon oxide film, the film-forming method comprising:
   forming a tungsten film or a tungsten oxide film on a surface of a silicon wafer, the tungsten film or the tungsten oxide film having a first exposed surface and the silicon wafer having a second exposed surface after forming the tungsten film or the tungsten oxide film;
   heating the first exposed surface and the second exposed surface;
   forming a seed layer both on the first exposed surface and on the second exposed surface by supplying an aminosilane-based gas simultaneously both on the heated first exposed surface and on the heated second exposed surface, the seed layer being a silicon layer; and
   forming a silicon oxide film on the seed layer by simultaneously supplying a silicon material gas including silicon and a gas including an oxidizing agent for oxidizing silicon on the seed layer.

2. The film-forming method of claim 1, wherein the aminosilane-based gas is selected from among gases including at least one of:
   BAS (butylaminosilane);
   BTBAS (bis(tertiarybutylamino)silane);
   DMAS (dimethylaminosilane);
   BDMAS (bis(dimethylamino)silane);
   TDMAS (tri(dimethylamino)silane);
   DEAS (diethylaminosilane);
   BDEAS (bis(diethylamino)silane);
   DPAS (dipropylaminosilane), and
   DIPAS (diisopropylaminosilane).

3. The film-forming method of claim 1, wherein the silicon material gas is an aminosilane-based gas, or a silane-based gas not including an amino group.

4. The film-forming method of claim 3, wherein the aminosilane-based gas is selected from among gases including at least one of:
   BAS (butylaminosilane);
   BTBAS (bis(tertiarybutylamino)silane);
   DMAS (dimethylaminosilane);
   BDMAS (bis(dimethylamino)silane);
   TDMAS (tri(dimethylamino)silane);
   DEAS (diethylaminosilane);
   BDEAS (bis(diethylamino)silane);
   DPAS (dipropylaminosilane); and
   DIPAS (diisopropylaminosilane), and
   the silane-based gas not including an amino group is selected from among gases including at least one of:
   $SiH_2$;
   $SiH_4$;
   $SiH_6$;
   $Si_2H_4$;
   $Si_2H_6$;
   a silicon hydride expressed as $Si_mH_{2m+2}$, where m is a natural number equal to or greater than 3; and
   a silicon hydride expressed as $Si_nH_{2n}$, where n is a natural number equal to or greater than 3.

5. The film-forming method of claim 4, wherein the silicon hydride expressed as $Si_mH_{2m+2}$, where m is a natural number equal to or greater than 3, is selected from at least one of:
   trisilane ($Si_3H_8$);
   tetrasilane ($Si_4H_{10}$);
   pentasilane ($Si_5H_{12}$);
   hexasilane ($Si_6H_{14}$); and
   heptasilane ($Si_7H_{16}$), and
   the silicon hydride expressed as $Si_nH_{2n}$, where n is a natural number equal to or greater than 3, is selected from at least one of:
   cyclotrisilane ($Si_3H_6$);
   cyclotetrasilane ($Si_4H_8$);
   cyclopentasilane ($Si_5H_{10}$);
   cyclohexasilane ($Si_6H_{12}$); and
   cycloheptasilane ($Si_7H_{14}$).

6. The film-forming method of claim 1, wherein the film-forming method is used to manufacture a semiconductor device.

* * * * *